US012463523B2

(12) United States Patent
Kamikura et al.

(10) Patent No.: US 12,463,523 B2
(45) Date of Patent: Nov. 4, 2025

(54) INTEGRATED CIRCUIT DEVICE

(71) Applicant: SEIKO EPSON CORPORATION, Tokyo (JP)

(72) Inventors: Haruki Kamikura, Chino (JP); Kinya Matsuda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 106 days.

(21) Appl. No.: 18/620,294

(22) Filed: Mar. 28, 2024

(65) Prior Publication Data

US 2024/0333128 A1   Oct. 3, 2024

(30) Foreign Application Priority Data

Mar. 30, 2023   (JP) ................................. 2023-055184

(51) Int. Cl.
| | |
|---|---|
| *H02M 7/02* | (2006.01) |
| *H02M 1/00* | (2006.01) |
| *H02M 3/155* | (2006.01) |
| *H02M 7/06* | (2006.01) |

(52) U.S. Cl.
CPC ....... *H02M 1/0048* (2021.05); *H02M 1/0025* (2021.05); *H02M 3/155* (2013.01); *H02M 7/06* (2013.01)

(58) Field of Classification Search
CPC .... H02M 1/00; H02M 1/0003; H02M 1/0025; H02M 1/0048; H02M 1/42; H02M 3/00; H02M 3/02; H02M 7/02; H02M 7/05

USPC ........ 327/530, 531, 534, 535, 537, 540, 543
See application file for complete search history.

(56) References Cited

U.S. PATENT DOCUMENTS

| | | | |
|---|---|---|---|
| 12,027,989 B2 * | 7/2024 | Olsson | .................... B60L 50/60 |
| 2006/0152206 A1 | 7/2006 | Yu | |
| 2013/0328615 A1 | 12/2013 | Sano et al. | |
| 2016/0307086 A1 | 10/2016 | Nozoe | |
| 2022/0271665 A1 | 8/2022 | Matsuda et al. | |

FOREIGN PATENT DOCUMENTS

| | | |
|---|---|---|
| JP | 2016-197468 A | 11/2016 |
| JP | 2016-201069 A | 12/2016 |
| JP | 2022-130276 A | 9/2022 |

* cited by examiner

*Primary Examiner* — Hai L Nguyen

(74) *Attorney, Agent, or Firm* — Rankin, Hill & Clark LLP

(57) ABSTRACT

An integrated circuit device includes: a semiconductor substrate set at a substrate potential; a rectifier circuit that rectifies an AC voltage by a rectifier element provided at the semiconductor substrate and outputs a rectified voltage; and a BGR circuit provided at the semiconductor substrate and generates a reference voltage based on the rectified voltage. The BGR circuit includes an operational amplifier having a first input terminal and a second input terminal, a diode element provided between the first input terminal and a substrate potential node, a resistor and a diode element provided in series between the second input terminal and the substrate potential node, a capacitor provided between the first input terminal and the substrate potential node, and a capacitor provided between the second input terminal and the substrate potential node.

9 Claims, 12 Drawing Sheets

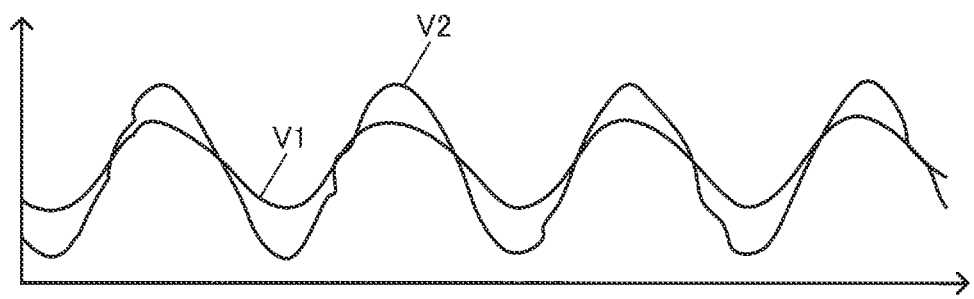
FIG. 8
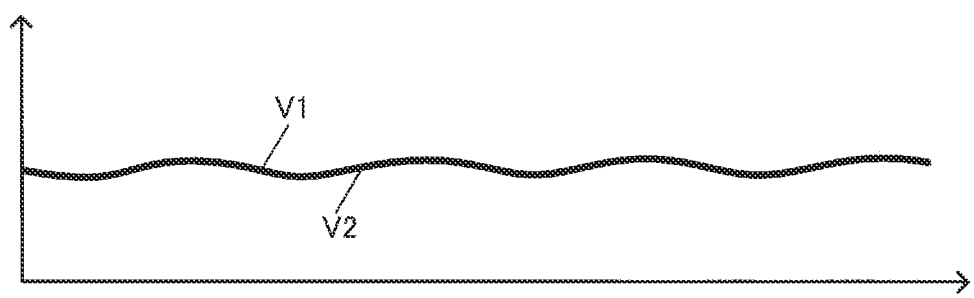
FIG. 9
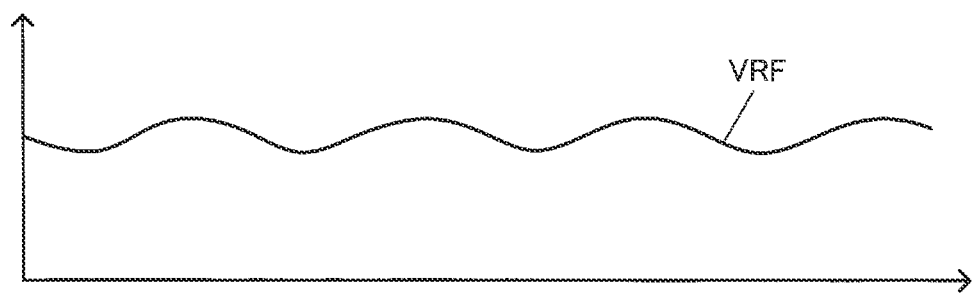

INTEGRATED CIRCUIT DEVICE

The present application is based on, and claims priority from JP Application Serial Number 2023-055184, filed Mar. 30, 2023, the disclosure of which is hereby incorporated by reference herein in its entirety.

BACKGROUND

1. Technical Field

The present disclosure relates to an integrated circuit device and the like.

2. Related Art

In the related art, a rectifier circuit that rectifies an AC voltage and outputs a rectified voltage is known. As such a rectifier circuit in the related art, for example, a circuit disclosed in JP-A-2016-201069 is known. In the rectifier circuit disclosed in JP-A-2016-201069, a clamp circuit is provided to limit an amplitude of the AC voltage input to the rectifier circuit in order to prevent an adverse effect that a rectification operation of the rectifier circuit has on a reference voltage.

JP-A-2016-201069 is an example of the related art.

However, when the amplitude of the AC voltage is limited by providing the clamp circuit as described above, deterioration in power receiving efficiency may occur.

SUMMARY

According to an aspect of the present disclosure, an integrated circuit device includes: a semiconductor substrate set at a substrate potential; a rectifier circuit configured to rectify an AC voltage by a rectifier element provided at the semiconductor substrate and output a rectified voltage; and a bandgap reference circuit provided at the semiconductor substrate and configured to generate a reference voltage based on the rectified voltage. The bandgap reference circuit includes an operational amplifier having a first input terminal and a second input terminal, a first diode element provided between the first input terminal and a substrate potential node, a resistor and a second diode element provided in series between the second input terminal and the substrate potential node, a first capacitor provided between the first input terminal and the substrate potential node, and a second capacitor provided between the second input terminal and the substrate potential node.

BRIEF DESCRIPTION OF THE DRAWINGS

FIG. 8 is a signal waveform example of input voltages and a reference voltage when no capacitor is provided.

FIG. 9 is a signal waveform example of the input voltages and the reference voltage when a capacitor is provided.

DESCRIPTION OF EMBODIMENTS

Hereinafter, a preferred embodiment of the present disclosure will be described in detail. The embodiment described below is not intended to limit the content of the present disclosure described in the claims, and all the configurations described in the embodiment are not necessarily essential as a solution of the present disclosure.

1. Integrated Circuit Device

Figure 1:
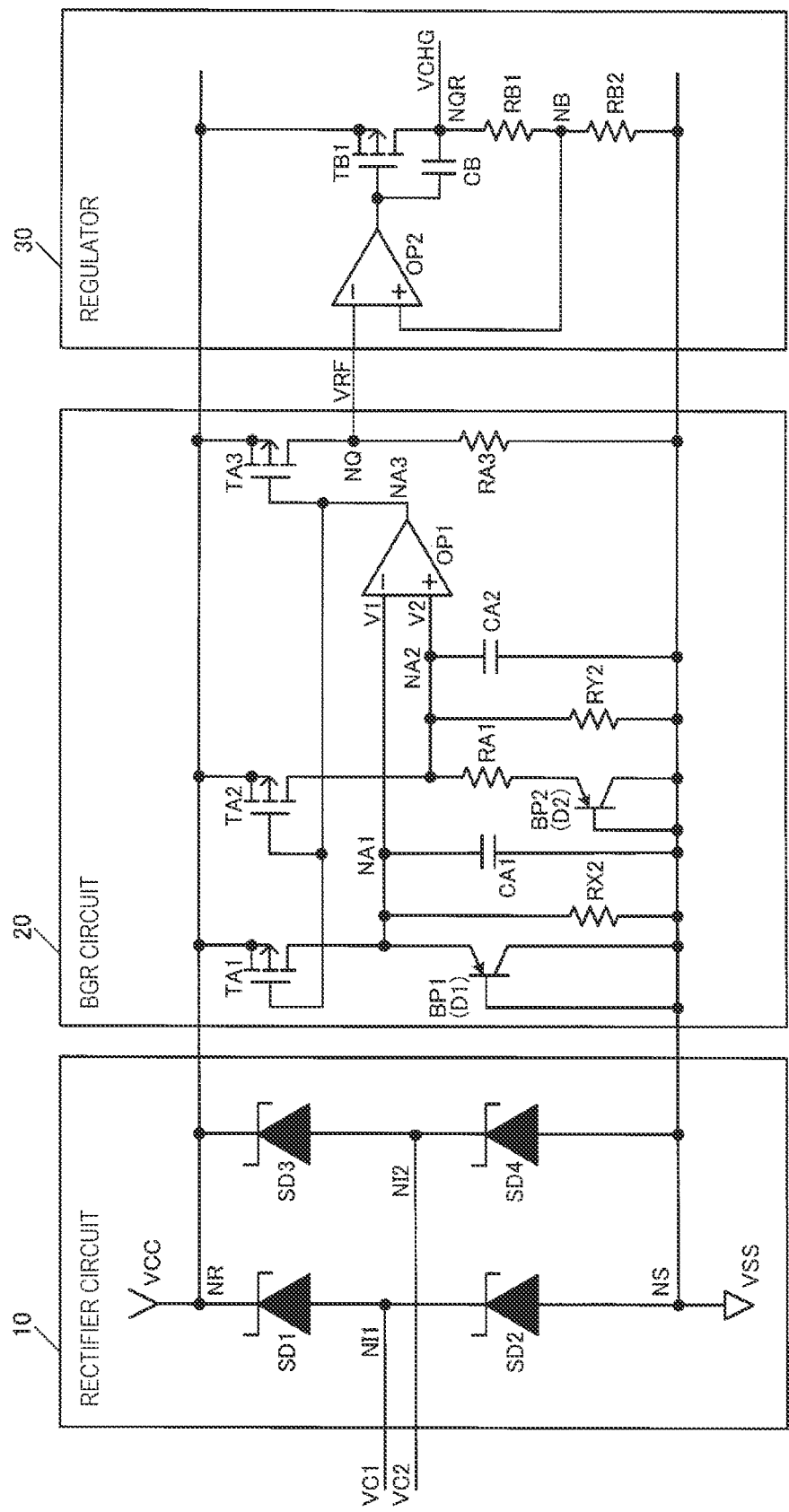
FIG. 1 shows a configuration example of an integrated circuit device according to an embodiment.
Figure 5:
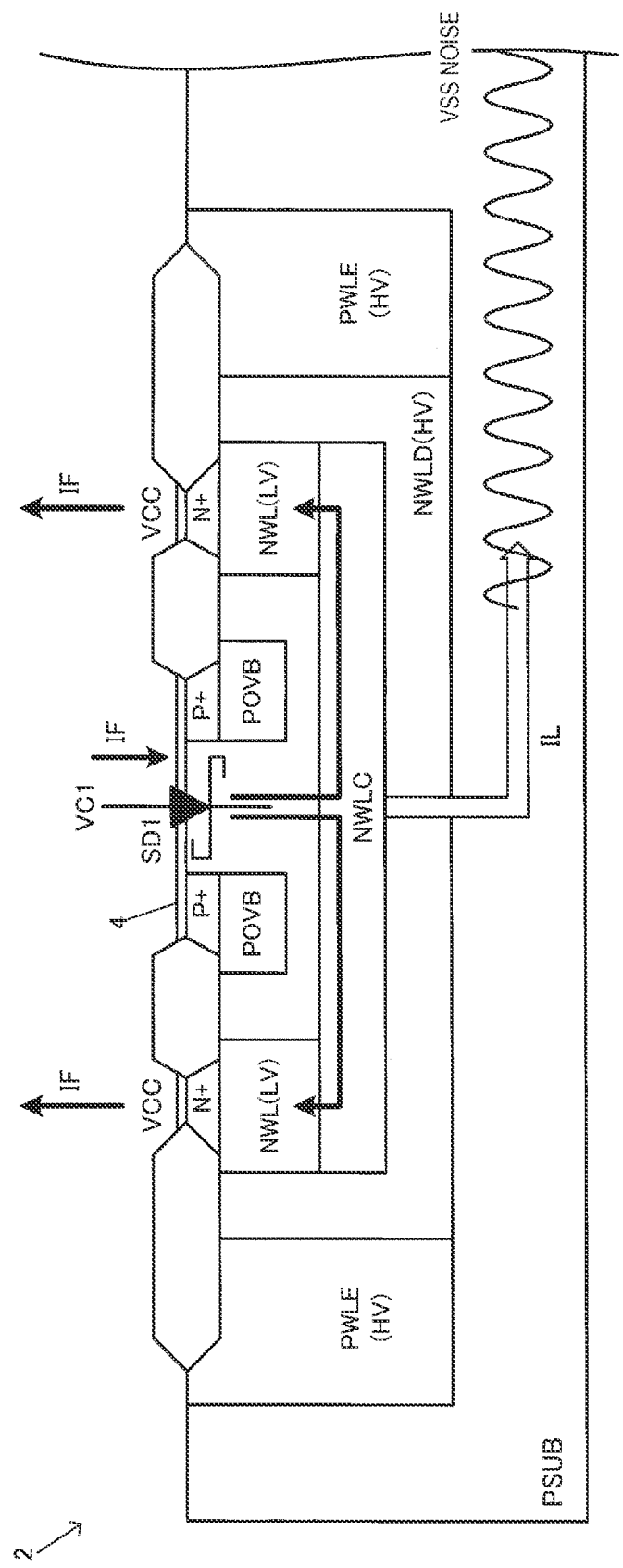
FIG. 5 is a diagram of noise at a substrate potential caused by a rectification operation.

FIG. 1 shows a configuration example of an integrated circuit device 2 according to the embodiment. The integrated circuit device 2 includes a rectifier circuit 10 and a BGR circuit 20. The integrated circuit device 2 may include a regulator 30. The integrated circuit device 2 includes a semiconductor substrate PSUB as shown in FIG. 5, which will be described later. The integrated circuit device 2 is not limited to the configuration shown in FIG. 1, configurations shown in FIGS. 2, 3, and the like to be described later, and various modifications can be made, such as omitting a part of components, adding other components, or replacing a part of components with other components.

The integrated circuit device 2 is a circuit device referred to as an integrated circuit (IC). For example, the integrated circuit device 2 is an IC manufactured by a semiconductor process, and is a semiconductor chip in which circuit elements are formed at the semiconductor substrate PSUB. The circuit element is formed in, for example, a P-type well or an N-type well formed in the semiconductor substrate PSUB. The circuit element includes active elements such as transistors and diodes, and passive elements such as resistors, capacitors, and inductors. Coupling in the embodiment is electrical coupling. The electrical coupling is coupling in which an electrical signal can be transmitted and information can be transmitted through the electrical signal. The electrical coupling may be coupling through a passive element and the like.

The semiconductor substrate PSUB is set at a substrate potential. In FIG. 1, the semiconductor substrate PSUB is set at a potential of VSS as the substrate potential. The semiconductor substrate PSUB is, for example, a P-type substrate. However, the semiconductor substrate may be an N-type substrate.

The rectifier circuit 10 rectifies AC voltages VC1 and VC2 by a rectifier element provided at the semiconductor substrate PSUB and outputs a rectified voltage VCC. The rectifier element is implemented by a diode or a transistor.

Figure 2:
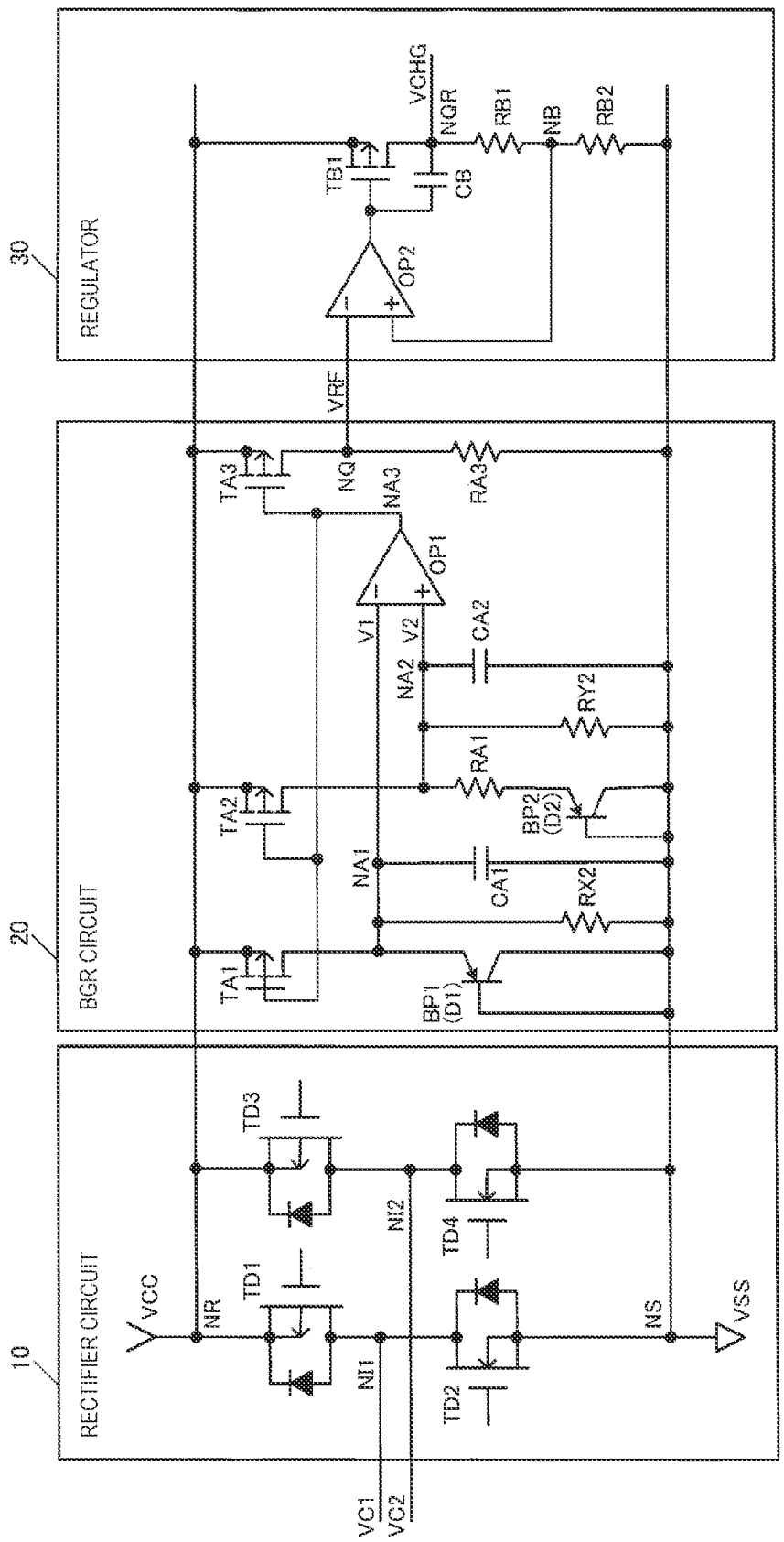
FIG. 2 shows another configuration example of the integrated circuit device according to the embodiment.

In FIG. 1, the rectifier circuit 10 performs a rectification operation using diodes SD1, SD2, SD3, and SD4 as the rectifier elements. Alternatively, as shown in FIG. 2 to be described later, the rectifier circuit 10 may perform the rectification operation using transistors TD1, TD2, TD3, and TD4 as the rectifier elements. Alternatively, the rectification operation may be performed by combining the diode and the transistor. The AC voltage VC1 is a first AC voltage, and the AC voltage VC2 is a second AC voltage having a phase opposite to that of the AC voltage VC1. The rectified voltage VCC is a first rectified voltage on a high-potential side. VSS can be referred to as, for example, a second rectified voltage on a low-potential side. The rectifier circuit 10 receives the voltage VC1, which is the first AC voltage, and the voltage VC2, which is the second AC voltage having a phase opposite to the voltage VC1, and performs, for example, full-wave rectification to output the voltage VCC, which is the first rectified voltage on the high-potential side, and VSS, which is the second rectified voltage on the low-potential side.

In FIG. 1, the rectifier circuit 10 includes Schottky-type diodes SD1, SD2, SD3, and SD4 as the rectifier elements. The diodes SD1, SD2, SD3, and SD4 are a first diode, a second diode, a third diode, and a fourth diode, respectively. The diode SD1 as the first diode is provided between an input node NI1 and a rectified voltage node NR of the rectifier circuit 10. The diode SD2 as the second diode is provided between the input node NI1 and a substrate potential node NS. The diode SD3 as the third diode is provided between an input node NI2 and the rectified voltage node NR of the rectifier circuit 10. The diode SD4 as the fourth diode is provided between the input node NI2 and the substrate potential node NS. The input node NI1 is a first input node to which the AC voltage VC1 is input. The input node NI2 is a second input node to which the AC voltage VC2 is input. The diodes SD1 and SD3 are diodes whose forward direction is a direction from the input nodes NI1 and NI2 to the rectified voltage node NR. The diodes SD2 and SD4 are diodes whose forward direction is a direction from the substrate potential node NS, which is the rectified voltage node on the low-potential side, to the input nodes NI1 and NI2. The Schottky-type diode is referred to as a Schottky barrier diode, and is a diode that utilizes a Schottky barrier generated by a junction between a metal and a semiconductor. Since the Schottky-type diode operates using majority carriers, a forward voltage drop is smaller than that of a PN junction diode and a switching speed is higher than that of the PN junction diode. It is also possible to adopt a modification in which the PN junction diodes are used as the diodes SD1, SD2, SD3, and SD4. The PN junction diode is a diode formed by a junction of a P-type semiconductor layer and an N-type semiconductor layer.

As described above, in FIG. 1, the rectification operation is performed using the Schottky-type diodes SD1, SD2, SD3, and SD4 as the rectifier elements. When the Schottky-type diodes SD1, SD2, SD3, and SD4 having a high switching speed are used as described above, the rectifier circuit 10 can appropriately perform the rectification operation to generate the rectified voltage VCC even when frequencies of the AC voltages VC1 and VC2 are high. For example, in the embodiment, the rectifier circuit 10 rectifies the AC voltages VC1 and VC2 having a frequency of 10 MHz or more, and the Schottky-type diodes SD1, SD2, SD3, and SD4 are used, appropriate rectification operation can be performed even for such high frequency AC voltages VC1 and VC2.

The BGR circuit 20 is a bandgap reference circuit that is provided at the semiconductor substrate PSUB and generates a reference voltage VRF based on the rectified voltage VCC. BGR is an abbreviation for bandgap reference. The BGR circuit 20 uses a bandgap voltage of the semiconductor to generate and output the reference voltage VRF that is a constant voltage even when there is an environmental fluctuation.

In FIG. 1, the BGR circuit 20 includes an operational amplifier OP1, bipolar transistors BP1 and BP2, and a resistor RA1. The bipolar transistor BP1 is a first bipolar transistor, and operates as, for example, a diode element D1 which is a first diode element. The bipolar transistor BP2 is a second bipolar transistor, and operates as, for example, a diode element D2 which is a second diode element. In FIG. 1, the BGR circuit 20 includes capacitors CA1 and CA2. The capacitor CA1 is a first capacitor, and the capacitor CA2 is a second capacitor.

The operational amplifier OP1 has a first input terminal and a second input terminal. The operational amplifier OP1 is a differential amplifier circuit. In FIG. 1, the first input terminal is, for example, an inverting input terminal, and the second input terminal is, for example, a non-inverting input terminal, and the present disclosure is not limited thereto. For example, the operational amplifier OP1 may include a differential circuit having a differential pair transistor and an output circuit that outputs an output voltage based on a signal from the differential circuit. The operational amplifier OP1 performs differential amplification on an input voltage V1 input to the first input terminal and an input voltage V2 input to a second input terminal, and outputs an output voltage to an output terminal. The input voltage V1 is a first input voltage, and the input voltage V2 is a second input voltage.

The bipolar transistor BP1 as the diode element D1 is provided between the first input terminal of the operational amplifier OP1 and the substrate potential node NS. For example, the bipolar transistor BP1 has diode coupling in which a base and a collector are coupled. Accordingly, the bipolar transistor BP1 operates as the diode element D1. Specifically, in a pnp-type bipolar transistor BP1, an emitter is coupled to a node NA1 of the first input terminal of the operational amplifier OP1, and the base and the collector are coupled to the substrate potential node NS. Further, the PN junction between the emitter and the base functions as the diode element D1. A node NA1 side of the diode element D1 is an anode, and a node NS side is a cathode.

The bipolar transistor BP2 as the diode element D2 and the resistor RA1 are provided in series between the second input terminal of the operational amplifier OP1 and the substrate potential node NS. For example, the bipolar transistor BP2 has diode coupling in which a base and a collector are coupled. Accordingly, the bipolar transistor BP2 operates as the diode element D2. Specifically, in a pnp-type bipolar transistor BP2, one end of an emitter is coupled to the other end of the resistor RA1 coupled to a node NA2 of the second input terminal, and the base and the collector are coupled to the substrate potential node NS. Further, the PN junction between the emitter and the base functions as the diode element D2. A node NA2 side of the diode element D2 is an anode, and a node NS side is a cathode.

The capacitor CA1 which is a first capacitor is provided between the first input terminal of the operational amplifier OP1 and the substrate potential node NS. For example, one end of the capacitor CA1 is coupled to the node NA1 of the first input terminal, and the other end is coupled to the substrate potential node NS.

The capacitor CA2 which is a second capacitor is provided between the second input terminal of the operational amplifier OP1 and the substrate potential node NS. For example, one end of the capacitor CA2 is coupled to the node NA2 of the second input terminal, and the other end is coupled to the substrate potential node NS.

Figure 3:
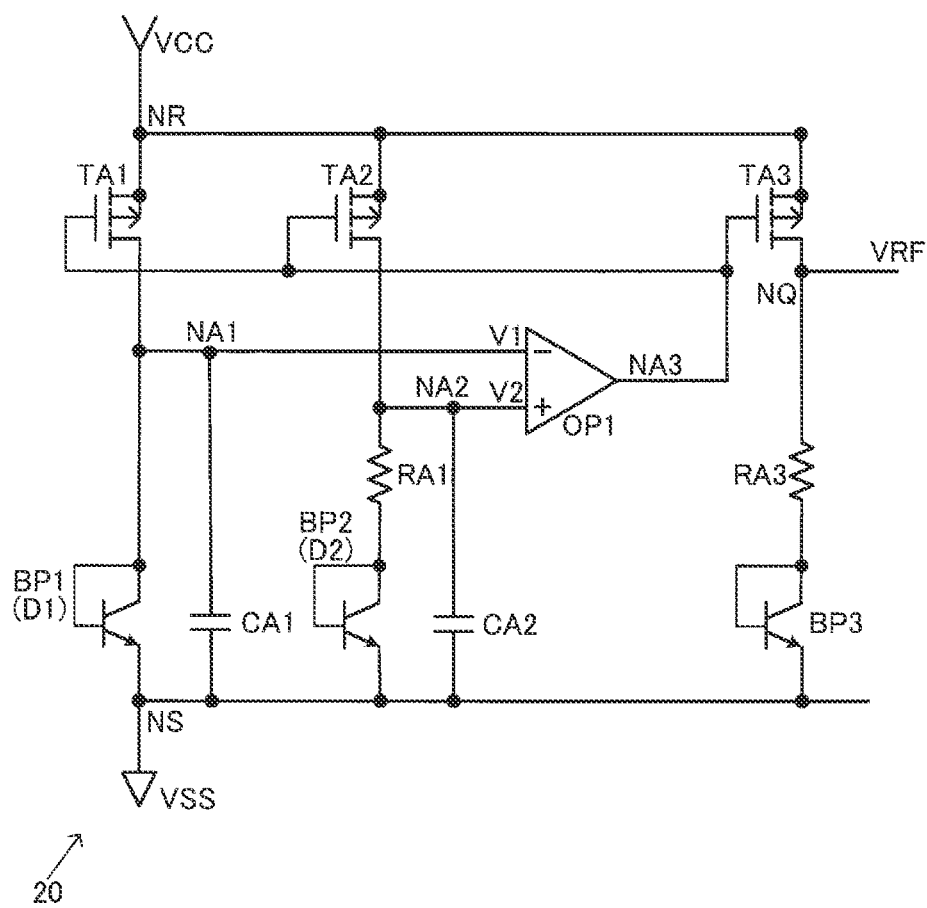
FIG. 3 is another configuration example of a bandgap reference circuit.

In FIG. 1, the BGR circuit 20 includes a resistor RX2 provided between the first input terminal of the operational amplifier OP1 and the substrate potential node NS, and a resistor RY2 provided between the second input terminal of the operational amplifier OP1 and the substrate potential node NS. The resistor RX2 has one end coupled to the node NA1 and the other end coupled to the substrate potential node NS. The resistor RY2 has one end coupled to the node NA2 and the other end coupled to the substrate potential node NS. For example, as shown in FIG. 3 to be described later, the resistors RX2 and RY2 may not be provided.

In FIG. 1, the BGR circuit 20 includes a transistor TA1 and a transistor TA2. The transistor TA1 is a first transistor, is provided between the rectified voltage node NR and the first input terminal of the operational amplifier OP1, and has a gate coupled to the output terminal of the operational amplifier OP1. For example, a P-type transistor TA1 has a source coupled to the rectified voltage node NR, a gate coupled to the output terminal of the operational amplifier OP1, and a drain coupled to the node NA1 of the first input terminal. The transistor TA2 is a second transistor, is provided between the rectified voltage node NR and the second input terminal of the operational amplifier OP1, and has a gate coupled to the output terminal of the operational amplifier OP1. For example, a P-type transistor TA2 has a source coupled to the rectified voltage node NR, a gate coupled to the output terminal of the operational amplifier OP1, and a drain coupled to the node NA2 of the second input terminal. The P-type or N-type transistor in the embodiment is, for example, a MOS transistor.

In this way, in the BGR circuit 20 according to the embodiment, the transistors TA1 and TA2 are provided between the rectified voltage node NR and the first input terminal and the second input terminal of the operational amplifier OP1, and the gates of the transistors TA1 and TA2 are controlled by an output of the operational amplifier OP1. In this way, feedback control is performed so that the first input terminal and the second input terminal have the same voltage due to a virtual ground of the operational amplifier OP1. Accordingly, a current due to the feedback control flows through the bipolar transistor BP1 provided in series with the transistor TA1 and the bipolar transistor BP2 provided in series with the transistor TA2, and the BGR circuit 20 can output the reference voltage VRF based on the bandgap voltage.

In FIG. 1, the BGR circuit 20 includes a transistor TA3 and an output resistor RA3. For example, the transistor TA3 is a third transistor, is provided between the rectified voltage node NR and an output node NQ of the BGR circuit 20, and has a gate coupled to the output terminal of the operational amplifier OP1. For example, a P-type transistor TA3 has a source coupled to the rectified voltage node NR, a gate coupled to the output terminal of the operational amplifier OP1, and a drain coupled to the output node NQ of the BGR circuit 20. The output resistor RA3 is provided between the output node NQ of the BGR circuit 20 and the substrate potential node NS. For example, the output resistor RA3 has one end coupled to the output node NQ and the other end coupled to the substrate potential node NS.

In this way, under control of the output of the operational amplifier OP1, a current equal to the current flowing through the transistors T1 and T2 flows through the transistor TA3 and flows through the output resistor RA3. Accordingly, the reference voltage VRF set by the current and a resistance value of the output resistor RA3 can be output from the BGR circuit 20.

For example, base-emitter voltages of the bipolar transistors BP1 and BP2 are represented by VBE1 and VBE2, respectively, and a size ratio which is a ratio of emitter areas of the bipolar transistor BP1 and the bipolar transistor BP2 is represented by N. N is a value of about 4 to 10 as an example. In this case, ΔVBE=VBE1−VBE2, which is a difference between the base-emitter voltages, is represented by the following Equation (1). Here, k is the Boltzmann constant, T is the Kelvin temperature, and q is an electron charge amount.

$$\Delta VBE = (kT/q) \times \ln(N) \tag{1}$$

A resistance value of the resistor RA1 is R1, and resistance values of the resistors RX2 and RY2 are R2. A current I1 flowing through the resistor RA1 and the bipolar transistor BP2 is represented by the following Equation (2), and a current I2 flowing through the resistor RY2 is represented by the following Equation (3). A current I flowing through the transistor TA2 is represented by the following Equation (4).

$$I1 = \Delta VBE/R1 \tag{2}$$

$$I2 = VBE1/R2 \tag{3}$$

$$I = I1 + I2 = \Delta VBE/R1 + VBE1/R2 \tag{4}$$

Further, when a resistance value of the output resistor RA3 is R3, the current I flows through the transistor TA3 from a current mirror and flows through the output resistor RA3, and thus the reference voltage VRF=I×R3 is generated. Here, ΔVBE has positive temperature characteristics, the base-emitter voltage VBE has negative temperature characteristics, and the resistance values R1, R2, and R3 have positive temperature characteristics or negative temperature characteristics. Therefore, the reference voltage VRF having flat temperature characteristics can be generated by appropriately combining these temperature characteristics.

As shown in FIG. 1, the integrated circuit device 2 includes the regulator 30 that regulates the rectified voltage VCC based on the reference voltage VRF output by the BGR circuit 20 and outputs a regulated voltage VCHG. For example, the regulator 30 generates and outputs the regulated voltage VCHG obtained by stepping down the rectified voltage VCC based on the reference voltage VRF. In this way, the stable reference voltage VRF of a constant voltage output from the BGR circuit 20 can be used to generate the regulated voltage VCHG of the constant voltage obtained by regulating the rectified voltage VCC.

For example, in FIG. 1, the regulator 30 includes an operational amplifier OP2, a drive transistor TB1, and resistors RB1 and RB2. The regulator 30 may include a phase compensation capacitor CB.

The operational amplifier OP2 is a second operational amplifier and a differential amplifier circuit. The operational amplifier OP2 has a first input terminal and a second input terminal. The first input terminal is, for example, an inverting input terminal, and the second input terminal is, for example, a non-inverting input terminal. The reference voltage VRF from the BGR circuit 20 is input to the first input terminal of the operational amplifier OP2.

A gate of the drive transistor TB1 is controlled by an output of the operational amplifier OP2. For example, a P-type drive transistor TB1 has a source coupled to the rectified voltage node NR, a gate coupled to an output terminal of the operational amplifier OP2, and a drain coupled to an output node NQR of the regulator 30.

The resistor RB1 and the resistor RB2 are provided in series between the drive transistor TB1 and the substrate potential node NS. The resistor RB1 and the resistor RB2 are a first resistor and a second resistor, respectively. For example, the resistor RB1 has one end coupled to the output node NQR of the regulator 30 and the other end coupled to one end of the resistor RB2. The resistor RB2 has one end coupled to the other end of the resistor RB1 and the other end coupled to the substrate potential node NS. A second input terminal of the operational amplifier OP2 is coupled to a coupling node NB between the resistor RB1 and the resistor RB2.

In this way, the regulator 30 can output the regulated voltage VCHG of a voltage set by the reference voltage VRF from the BGR circuit 20 and the resistance values of the resistors RB1 and RB2. For example, when the resistance values of the resistors RB1 and RB2 are R1 and R2, the regulator 30 can output the regulated voltage VCHG that satisfies VCHG={(R1+R2)/R2}×VRF.

The regulator 30 includes the phase compensation capacitor CB. The phase compensation capacitor CB is provided, for example, between the output terminal of the operational amplifier OP2 and the output node NQR of the regulator 30. For example, one end of the phase compensation capacitor CB is coupled to the output terminal of the operational amplifier OP2, and the other end is coupled to a drain of the drive transistor TB1. By providing such a phase compensation capacitor CB, it is possible to appropriately compensate a phase in a feedback loop including the operational amplifier OP2 and prevent oscillation from occurring.

FIG. 2 shows another configuration example of the integrated circuit device 2. The configuration of the rectifier circuit 10 in FIG. 2 is different from that in FIG. 1. For example, in FIG. 2, the transistors TD1, TD2, TD3, and TD4 are provided as the rectifier elements. The transistors TD1, TD2, TD3, and TD4 are a first transistor, a second transistor, a third transistor, and a fourth transistor, respectively. P-type transistors TD1 and TD3 are provided, for example, between the rectified voltage node NR and the input nodes NI1 and NI2. N-type transistors TD2 and TD4 are provided, for example, between the input nodes NI1 and NI2 and the substrate potential node NS. Gates of the transistors TD1, TD2, TD3, and TD4 are controlled by a control circuit (not shown) and turned on or off. For example, in a first period of rectification, the transistors TD1 and TD4 are turned on, and the transistors TD2 and TD3 are turned off. In a second period of rectification, the transistors TD1 and TD4 are turned off, and the transistors TD2 and TD3 are turned on. A parasitic diode of each transistor also functions as a rectifier element.

FIG. 3 shows another configuration example of the BGR circuit 20. In FIG. 3, an npn-type bipolar transistor BP1 is used as the diode element D1, and an npn-type bipolar transistor BP2 is used as the diode element D2. The bipolar transistors BP1 and BP2 have diode coupling in which a collector and a base are coupled, and thus operate as the diode elements D1 and D2. For example, in the npn-type bipolar transistor BP1, the collector and the base are coupled to the node NA1, and an emitter is coupled to the substrate potential node NS. The npn-type bipolar transistor BP2 has the collector and the base coupled to the other end of the resistor RA1 having one end coupled to the node NA2, and an emitter coupled to the substrate potential node NS. For example, the PN junction between the base and the emitter of the bipolar transistor BP1 functions as the diode element D1, and the PN junction between the base and the emitter of the bipolar transistor BP2 functions as the diode element D2.

As described above, in the embodiment, the diode elements D1 and D2 are implemented by the diode-coupled bipolar transistors BP1 and BP2. For example, in FIG. 1, the bases and collectors of the pnp-type bipolar transistors BP1 and BP2 are coupled to the substrate potential node NS, thereby implementing the diode elements D1 and D2. In FIG. 3, the diode element D1 is implemented by coupling the base and the collector of the npn-type bipolar transistor BP1 to the node NA1. The base and the collector of the npn-type bipolar transistor BP2 are coupled to the resistor RA1, thereby implementing the diode element D2. In this way, the diode elements D1 and D2 can be implemented using the PN junctions between the bases and the emitters of the bipolar transistors BP1 and BP2. Further, by using the base-emitter voltages of the bipolar transistors BP1 and BP2 or a difference between the base-emitter voltages of the bipolar transistors BP1 and BP2, the reference voltage VRF, which is a bandgap reference voltage, can be generated.

In FIG. 3, the output resistor RA3 and a bipolar transistor BP3 are provided in series between the output node NQ of the BGR circuit 20 and the substrate potential node NS. For example, a collector and a base of the bipolar transistor BP3 are coupled to the other end of the output resistor RA3 having one end coupled to the output node NQ. The substrate potential node NS is coupled to the emitter of the bipolar transistor BP3. In this way, the npn-type bipolar transistor BP3 has diode coupling in which the collector and the base are coupled. Accordingly, a voltage obtained by adding the voltage resulting from a current flowing from the transistor TA3 to the output resistor RA3 and the base-emitter voltage of the bipolar transistor BP3 is output from the BGR circuit 20 as the reference voltage VRF.

The BGR circuit 20 is not limited to the configuration shown in FIGS. 1 to 3, and various modifications can be made. For example, instead of a diode-coupled bipolar transistor, a normal PN junction diode may be used as the rectifier element. Coupling configurations of the transistor, the resistor, the operational amplifier, and the like are not limited to the coupling configurations of FIGS. 1 to 3, and various modifications are possible.

Figure 4:
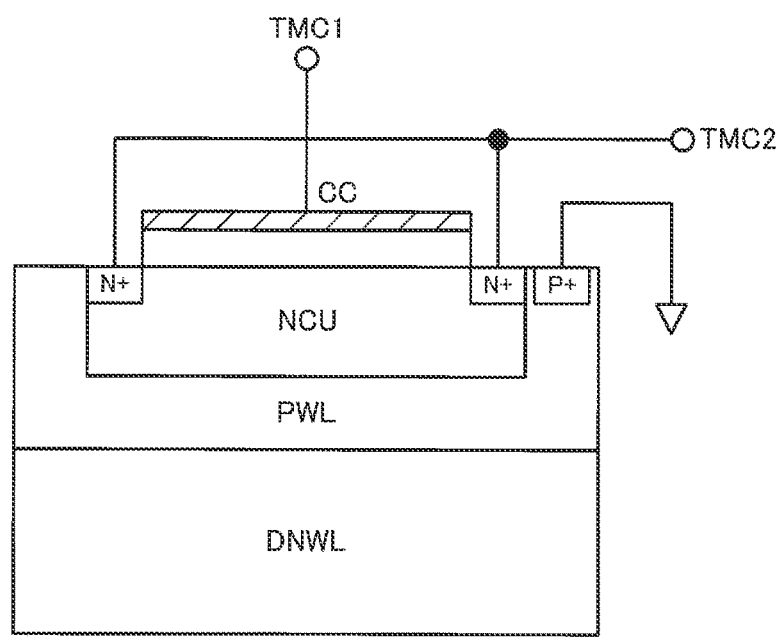
FIG. 4 is a structural example of a capacitor.

FIG. 4 shows an example of a structure of a capacitor CC that implements the capacitors CA1, CA2. In FIG. 4, a high-concentration N-type well DNWL is formed in a semiconductor substrate, and a P-type well PWL is formed in the N-type well DNWL. Further, a substrate potential is supplied to the P-type well PWL through an impurity layer of $P^+$. Further, an NCU, which is a cross-under impurity layer of $N^+$, is formed in the P-type well PWL. A polysilicon layer serving as a gate of the transistor is formed above the NCU. Further, the polysilicon layer is an upper electrode of the capacitor CC which is the capacitors CA1 and CA2, and the impurity layer of the NCU is a lower electrode of the capacitor CC. According to the structure of the capacitor using the NCU, a large capacitance can be obtained with a small layout area. The structure of the capacitor is not limited to that shown in FIG. 4, and various modifications can be made to, for example, a capacitor formed of two polysilicon layers or a capacitor formed of a gate capacitance.

2. Stabilization of Reference Voltage by Capacitor

The integrated circuit device 2 according to the embodiment is provided with the rectifier circuit 10 as shown in FIGS. 1 and 2, and it is determined that noise caused by the rectification operation in the rectifier circuit 10 may adversely affect the generation of the reference voltage VRF. For example, FIG. 5 is a diagram schematically showing a cross-sectional structure of the Schottky-type diode SD1 of FIG. 1. Cross-sectional structures of the diodes SD2 to SD4 are the same, and thus detailed description thereof will be omitted.

In FIG. 5, a P-type well PWLE and an N-type well NWLD are formed in the P-type semiconductor substrate PSUB, and an N-type well NWLC and an N-type well NWL are formed in the N-type well NWLD. The N-type well NWLD is, for example, a high-voltage N-type well with a high breakdown voltage, and the N-type well NWL is, for example, a low-voltage N-type well with a low breakdown voltage. HV represents a high voltage, and LV represents a low voltage. Further, an N-type diffusion layer ($N^+$) formed in the N-type well NWL serves as a cathode electrode of the Schottky-type diode SD1. A P-type buried layer POVB is formed in the N-type well, a P-type diffusion layer ($P^+$) is formed in the P-type buried layer POVB, and a metal layer 4 is formed on the P-type diffusion layer. The metal layer 4 or the like serves as an anode electrode of the Schottky-type diode SD1. For example, cobalt or a cobalt alloy is used as the metal layer 4, and specifically, cobalt silicide is used. However, titanium or a titanium alloy may be used as the metal layer 4. For example, the Schottky-type diode SD1 is implemented by a Schottky barrier generated by a junction between the metal layer 4 and the N-type well.

When a forward current IF flows through the diode SD1 or the like as shown in FIG. 5 by the rectification operation of the rectifier circuit 10, a leak current IL also flows through the semiconductor substrate PSUB. When the leak current IL flows through the semiconductor substrate PSUB, noise occurs in VSS, which is the substrate potential. Further, problems such as a decrease in the reference voltage VRF occur due to the noise of VSS. For example, according to a magnitude of the forward current IF, a frequency of the AC voltage corresponding to a power transmission frequency, or the like, the noise of VSS changes, and a decrease amount of the reference voltage VRF also changes. Such noise caused by the rectification operation of the rectifier circuit 10 also occurs when the rectifier element of the rectifier circuit 10 is implemented by the transistors TD1 to TD4 as shown in FIG. 2.

Figure 6:
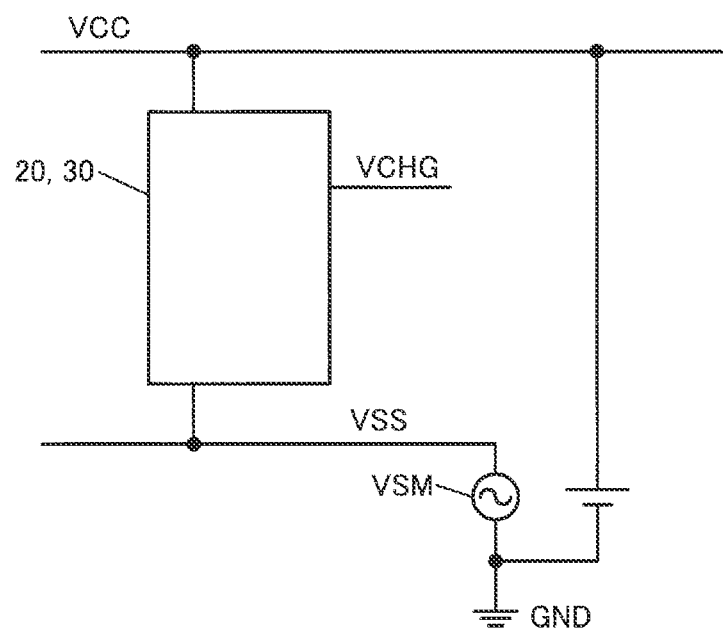
FIG. 6 is a diagram of a simulation in which a noise voltage is applied to VSS with GND as a reference.

For example, in FIG. 6, a circuit simulation regarding the influence of the noise on VSS is performed by applying an amplitude VSM corresponding to the noise to VSS with GND as a reference. For example, in a simulation result shown in FIG. 7, as the amplitude VSM corresponding to noise increases, the regulated voltage VCHG decreases. As a frequency f of the AC voltage is higher, a voltage decrease amount of the regulated voltage VCHG is larger. For example, in a product specification, the regulated voltage VCHG of 4.8 V decreases by about 0.4 V to 0.5 V at maximum. Such a decrease in the regulated voltage VCHG is caused by a decrease in the reference voltage VRF due to the noise from the rectifier circuit 10 as described in FIG. 5.

For example, the BGR circuit 20 according to the embodiment in FIGS. 1 to 3 operates under feedback control by the operational amplifier OP1 so that the input voltage V1 of the first input terminal and the input voltage V2 of the second input terminal of the operational amplifier OP1 are the same voltage due to the virtual ground in terms of DC. However, it is determined that the input voltage V1 and the input voltage V2 have different amplitudes or different phases in terms of AC.

That is, the bipolar transistor BP1 having a small emitter size and a small diode capacitance is provided between the node NA1 of the first input terminal of the operational amplifier OP1 and the substrate potential node NS. On the other hand, the resistor RA1 and the bipolar transistor BP2 having a large emitter size and a large diode capacitance are provided between the node NA2 of the second input terminal and the substrate potential node NS. Therefore, in a high frequency band, AC signal waveforms of the input voltage V1 and the input voltage V2 are different from each other, and a deviation occurs in the amplitude or the phase. For example, in a contactless power transmission system to be described later, the frequencies of the AC voltages VC1 and VC2 are increased for the purpose of reducing a size of coils. For example, in order to reduce the size of the coils, the rectifier circuit 10 rectifies the AC voltages VC1 and VC2 having a frequency of, for example, 10 MHz or more. Therefore, high-frequency noise from the rectifier circuit 10 operating at a high switching frequency is transmitted to the BGR circuit 20 through the semiconductor substrate PSUB as described in FIG. 5. Due to the high-frequency noise, a situation occurs in which the reference voltage VRF decreases and the regulated voltage VCHG decreases as described in FIG. 7.

Further, in the embodiment, as shown in FIGS. 1 to 3, the capacitor CA1 is provided between the node NA1 of the first input terminal of the operational amplifier OP1 and the substrate potential node NS, and the capacitor CA2 is provided between the node NA2 of the second input terminal and the substrate potential node NS. Here, the capacitances of the capacitors CA1 and CA2 are capacitances sufficiently larger than the diode capacitances of the bipolar transistors BP1 and BP2, which are the diode elements D1 and D2.

Figure 7:
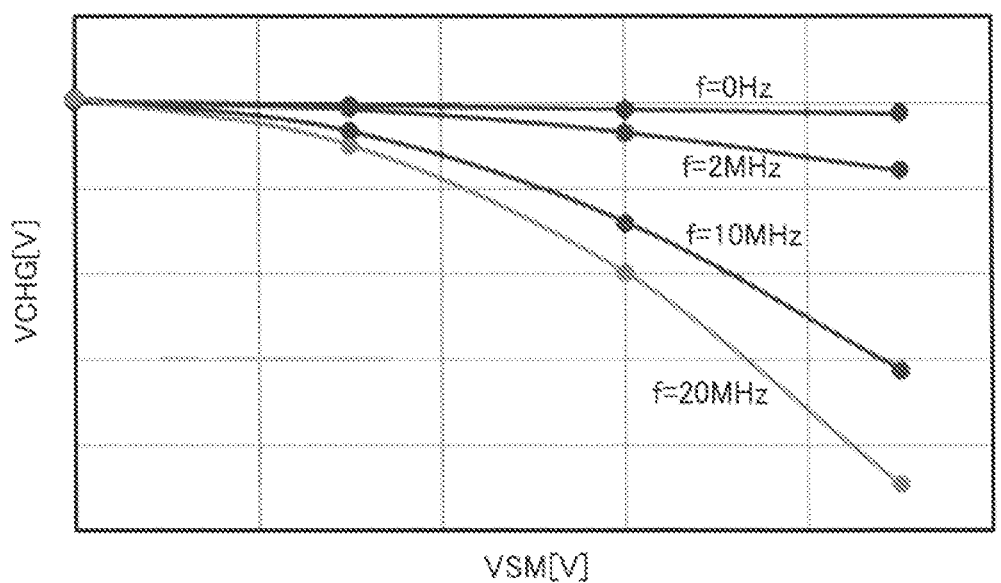
FIG. 7 is a diagram of a decrease in a regulated voltage due to noise at a reference potential.

For example, in FIGS. 1 to 3, first impedance characteristics in a first path through the bipolar transistor BP1 between the substrate potential node NS and the node NA1 and second impedance characteristics in a second path through the bipolar transistor BP2 and the resistor RA1 between the substrate potential node NS and the node NA2 are different impedance characteristics. This is because the diode capacitance of the bipolar transistor BP2 in the second path is larger than the diode capacitance of the bipolar transistor BP1 in the first path, and the resistor RA1 is present in the second path while the resistor is not present in the first path. Therefore, when noise occurs at the substrate potential node NS, the noise is transmitted to the node NA1 with the first impedance characteristics in the first path through the bipolar transistor BP1, and is transmitted to the node NA2 with the second impedance characteristics in the second path through the bipolar transistor BP2 and the resistor RA1. In this way, when the noise at the substrate potential node NS is transmitted to the node NA1 through the first path with the first impedance characteristics and transmitted to the node NA2 through the second path with the second impedance characteristics, an amplitude difference or a phase difference occurs between the input voltage V1 at the node NA1 and the input voltage V2 at the node NA2. Accordingly, a situation occurs in which the reference voltage VRF decreases as shown in FIG. 7.

In this regard, in the embodiment, a third path through the capacitor CA1 is provided in parallel with the first path through the bipolar transistor BP1, and a fourth path through the capacitor CA2 is provided in parallel with the second path through the bipolar transistor BP2 and the resistor RA2. Since the capacitors CA1 and CA2 are set at a large capacitance, impedance in the third path through the capacitor CA1 and impedance in the fourth path through the capacitor CA2 are lower than those in the first path and the second path in a high frequency band. Therefore, the noise at the substrate potential node NS is transmitted to the node NA1 of the first input terminal not through the first path through the bipolar transistor BP1 but through the third path of the capacitor CA1 whose impedance decreases in the high frequency band. The noise at the substrate potential node NS is transmitted to the node NA2 of the second input terminal not through the second path through the bipolar transistor BP2 and the resistor RA1, but through the fourth path of the capacitor CA2 whose impedance decreases in the high frequency band. As a result, the amplitude difference and the phase difference generated between the input voltage V1 at the node NA1 and the input voltage V2 at the node NA2 can be reduced, and a decrease in the reference voltage VRF due to the amplitude difference and the phase difference can be prevented, and thus it is possible to prevent the regulated voltage VCHG from decreasing.

For example, FIGS. 8 and 9 are signal waveform examples of the input voltages V1 and V2 and the reference voltage VRF when the noise with GND as a reference is applied to VSS being the substrate potential, as shown in FIG. 6. FIG. 8 is a signal waveform example when the capacitors CA1 and CA2 are not provided, and FIG. 9 is a signal waveform example when the capacitors CA1 and CA2 are provided.

In the case of FIG. 8 in which the capacitors CA1 and CA2 are not provided, the amplitude difference or phase difference between the input voltage V1 and the input voltage V2 increases, and the reference voltage VRF decreases accordingly. That is, in the case of FIG. 8, the bipolar transistor BP1 having a small diode capacitance is provided between the substrate potential node NS and the node NA1, while the bipolar transistor BP2 having a large diode capacitance and the resistor RA1 are provided between the substrate potential node NS and the node NA2. Therefore, the noise at the substrate potential node NS is transmitted to the node NA1 with the first impedance characteristics in the first path through the bipolar transistor BP1. Meanwhile, the noise at the substrate potential node NS is transmitted with the second impedance characteristics different from the first impedance characteristics in the second path through the bipolar transistor BP2 and the resistor RA1. Accordingly, the amplitude difference or the phase difference occurs between the input voltage V1 and the input voltage V2.

In contrast, in the case of FIG. 9 in which the capacitors CA1 and CA2 are provided, the amplitude difference and the phase difference between the input voltage V1 and the input voltage V2 are sufficiently small, and thus the situation in which the reference voltage VRF decreases as shown in FIG. 8 is prevented. That is, in the case of FIG. 9, for example, in the high frequency band, the noise at the substrate potential is transmitted to the nodes NA1 and NA2 not through the first path through the bipolar transistor BP1 or the second path through the bipolar transistor BP2 and the resistor RA1, but through the third path and the fourth path through the capacitors CA1 and CA2 having low impedance. Therefore, the occurrence of the amplitude difference or the phase difference between the input voltage V1 and the input voltage V2 due to a difference in the impedance characteristics between the first path and the second path is prevented. As a result, it is possible to prevent a decrease in the reference voltage VRF due to the amplitude difference or the phase difference between the input voltage V1 and the input voltage V2, and to prevent a decrease in the regulated voltage VCHG.

In FIGS. 8 and 9, an amplitude voltage corresponding to the noise is superimposed on VSS with GND as a reference as shown in FIG. 6. Therefore, also in the reference voltage VRF generated with VSS as a reference, an amplitude fluctuation the same as an amplitude fluctuation of VSS occurs when GND is used as a reference. However, when VSS is used as a reference, the reference voltage VRF becomes a constant voltage.

Figure 10:
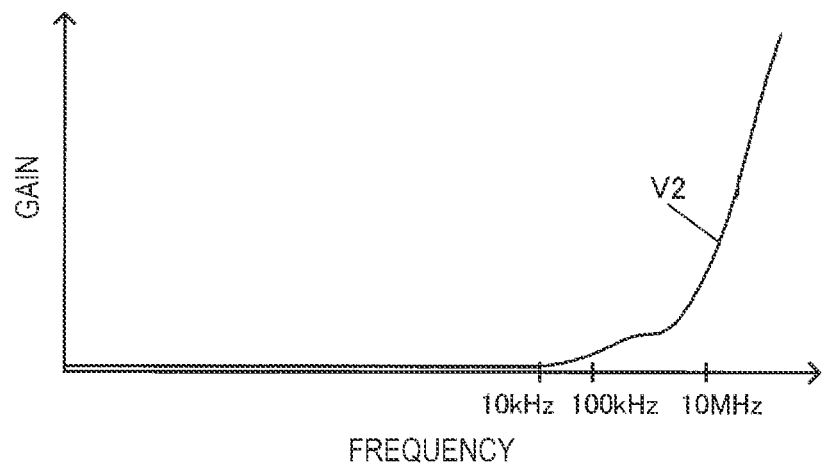
FIG. 10 is a diagram showing gains of amplitudes of the input voltages with respect to an amplitude of VSS when no capacitor is provided.
Figure 10:
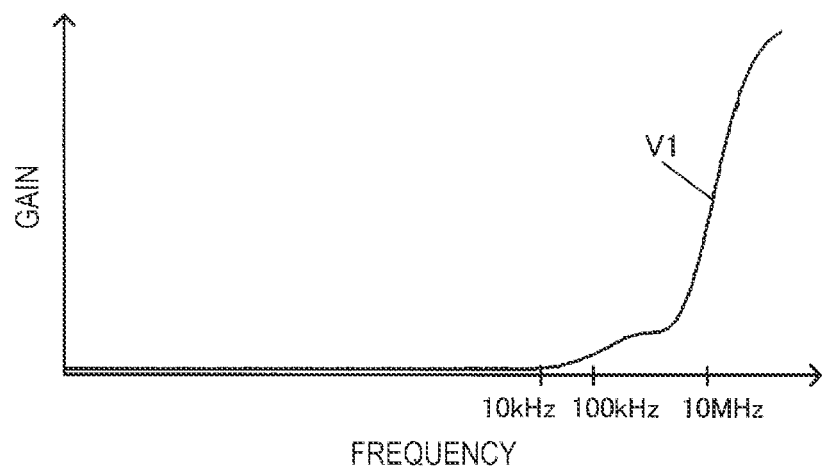
Figure 11:
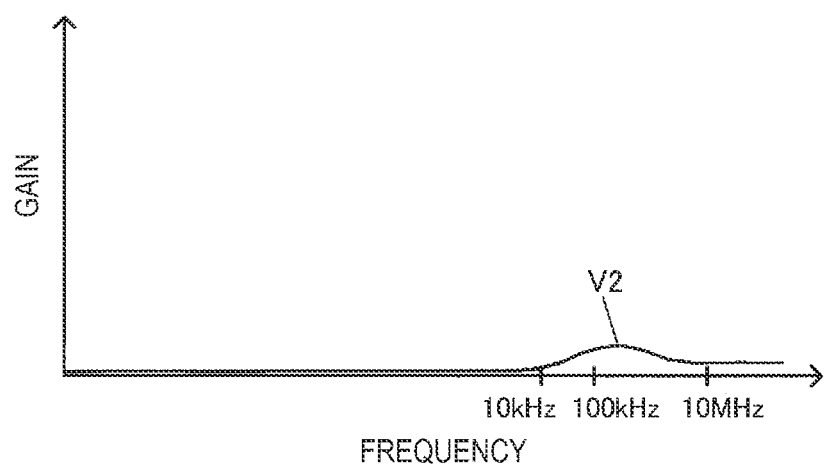
FIG. 11 is a diagram showing gains of the amplitudes of the input voltages with respect to the amplitude of VSS when a capacitor is provided.
Figure 11:
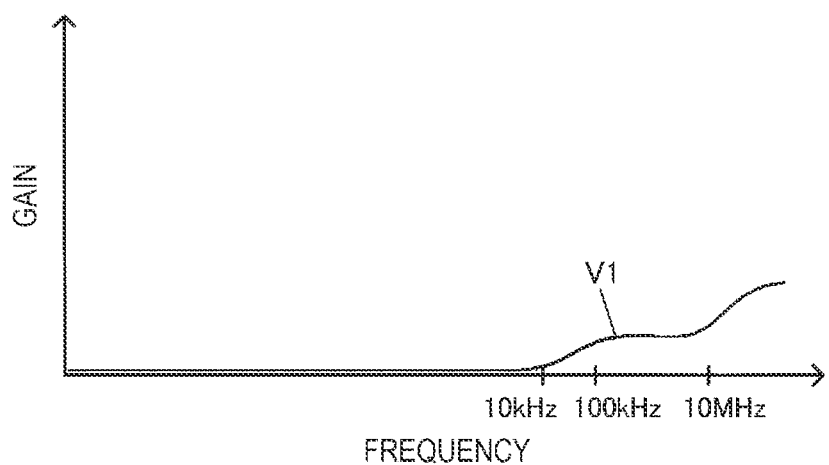

FIGS. 10 and 11 are diagrams showing gains of the amplitudes of the input voltages V1 and V2 with respect to the amplitude of VSS. In FIGS. 10 and 11, a horizontal axis represents a frequency, and a vertical axis represents a gain. The horizontal axis is a logarithmic scale. Scales of the vertical axis are different between the input voltage V1 and the input voltage V2.

FIG. 10 shows a case in which the capacitors CA1 and CA2 are not provided. In this case, in the high frequency band, the gains of the amplitudes of the input voltages V1 and V2 with respect to the amplitude of VSS is large. On the other hand, FIG. 11 shows a case in which the capacitors CA1 and CA2 are provided. In this case, in the high frequency band, the gains of the amplitudes of the input voltages V1 and V2 with respect to the amplitude of VSS can be made smaller than those in FIG. 10. When the gains of the amplitudes of the input voltages V1 and V2 with respect to the amplitude of VSS are close to 1 (0 dB), the input voltages V1 and V2 change with the same amplitude as the amplitude of VSS, and thus it is possible to prevent the reference voltage VRF from decreasing due to the amplitude difference.

Figure 12:
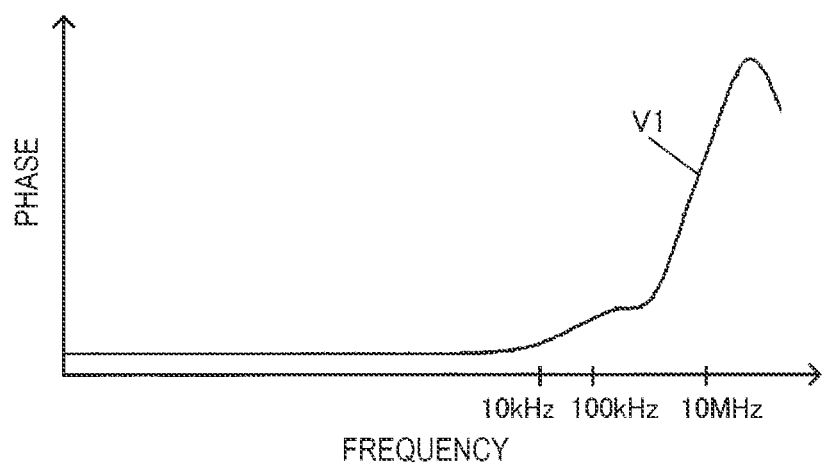
FIG. 12 is a diagram showing phases of the input voltages with respect to a phase of VSS when no capacitor is provided.
Figure 12:
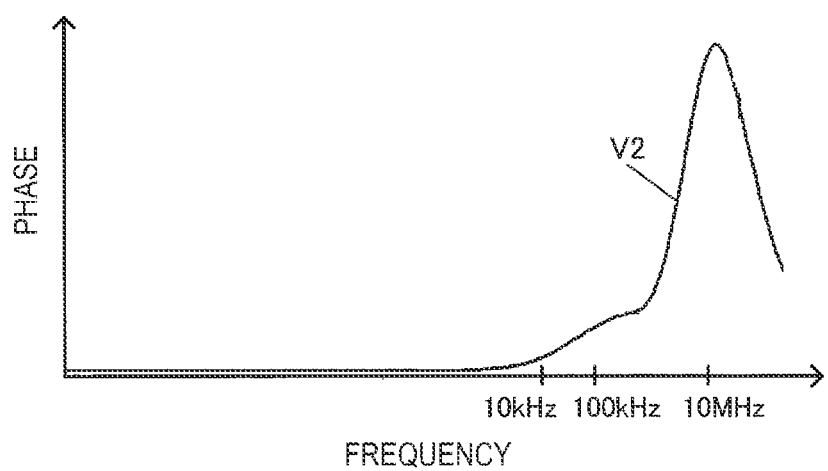
Figure 13:
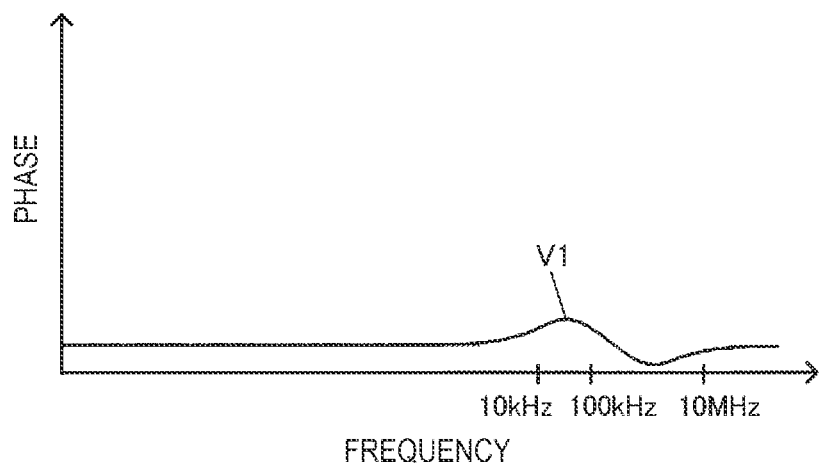
FIG. 13 is a diagram showing the phases of the input voltages with respect to the phase of VSS when a capacitor is provided.
Figure 13:
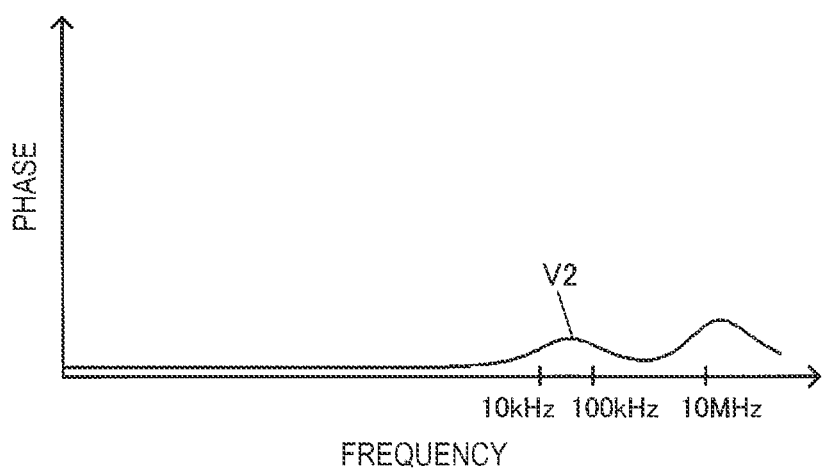

FIGS. 12 and 13 are diagrams showing a phase difference between the input voltages V1 and V2 with respect to a phase of VSS. In FIGS. 12 and 13, the horizontal axis represents a frequency, and the vertical axis represents a phase. Scales of the vertical axis are different between the input voltage V1 and the input voltage V2.

FIG. 12 shows a case in which the capacitors CA1 and CA2 are not provided. In this case, in the high frequency band, the phase difference between the input voltages V1 and V2 with respect to the phase of VSS is large. On the other hand, FIG. 13 shows a case in which the capacitors CA1 and CA2 are provided. In this case, in the high frequency band, the phase difference between the input voltages V1 and V2 with respect to the phase of VSS can be made smaller than that in FIG. 12. When the phase difference between the input voltages V1 and V2 with respect to the phase of VSS is close to 0, the phase difference between the input voltage V1 and the input voltage V2 can be reduced, and a decrease in the reference voltage VRF due to the phase difference can be prevented.

Figure 14:
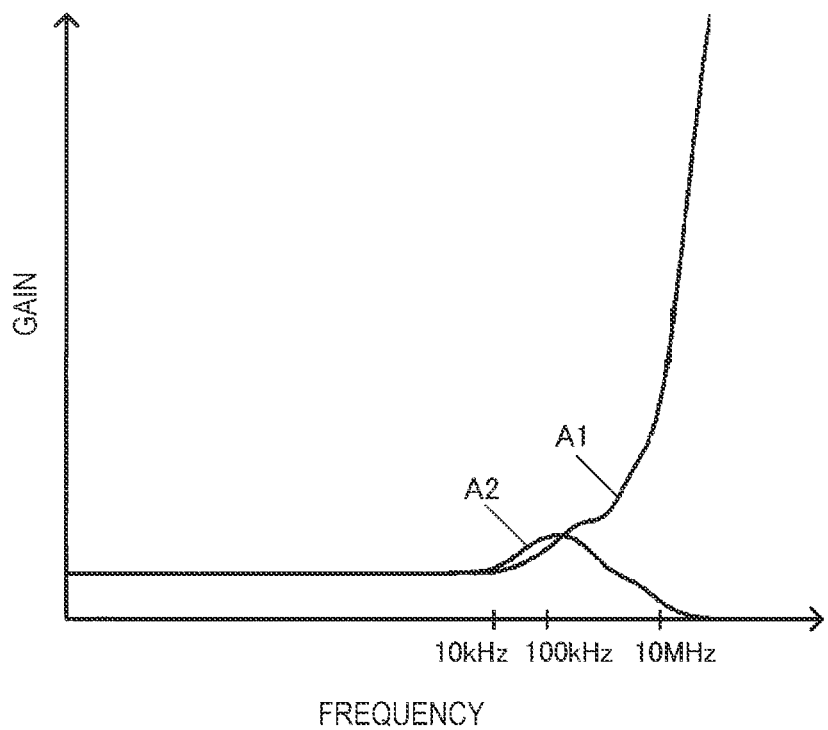
FIG. 14 is a diagram showing an amplitude of an input voltage V2 with respect to an input voltage V1.

FIG. 14 is a diagram showing a gain of the amplitude of the input voltage V2 with respect to the amplitude of the input voltage V1. In FIG. 14, the horizontal axis represents a frequency, and the vertical axis represents a gain. A1 in FIG. 14 indicates gain characteristics when the capacitors CA1 and CA2 are not provided, and A2 indicates gain characteristics when the capacitors CA1 and CA2 are provided. For example, until the frequency reaches about 10 kHz, the gain of the amplitude of the input voltage V1 with respect to the amplitude of the input voltage V2 is, for example, about 1 (0 dB) in both cases of A1 in which the capacitors CA1 and CA2 are not provided and A2 in which the capacitors CA1 and CA2 are provided, and almost no amplitude difference occurs. On the other hand, in the case of A1 in which the capacitors CA1 and CA2 are not provided in the high frequency band, the amplitude difference between the input voltage V1 and the input voltage V2 is large, and the reference voltage VRF decreases due to the amplitude difference. In contrast, in the case of A2 in which the capacitors CA1 and CA2 are provided, the amplitude difference between the input voltage V1 and the input voltage V2 does not occur so much even in the high frequency band, and the decrease in the reference voltage VRF due to the amplitude difference is prevented.

Figure 15:
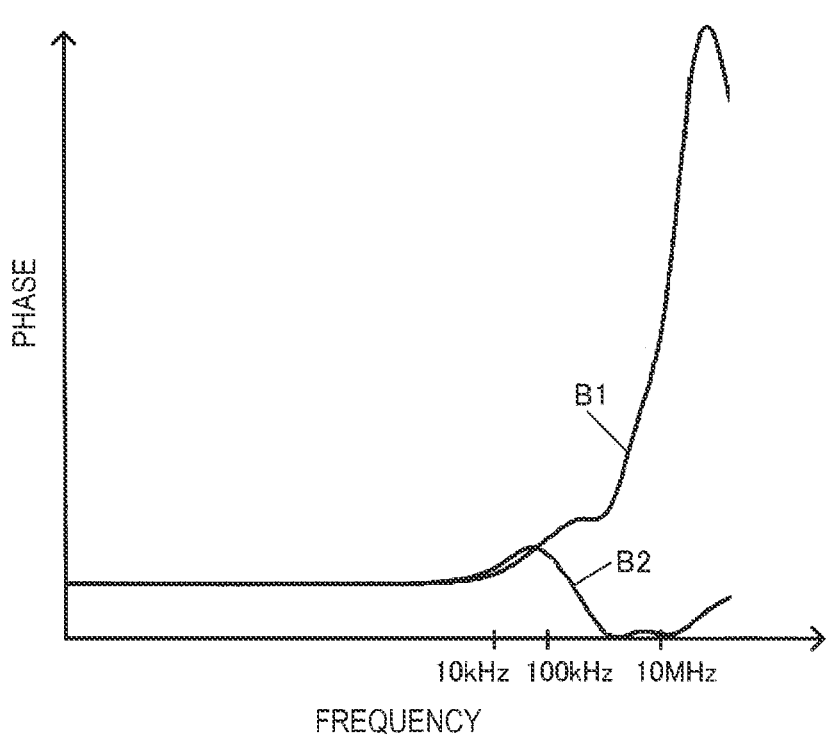
FIG. 15 is a diagram showing a phase of the input voltage V2 with respect to the input voltage V1.

FIG. 15 is a diagram showing the phase difference of the input voltage V2 with respect to the phase of the input voltage V1. In FIG. 15, the horizontal axis represents a frequency, and the vertical axis represents a phase. B1 in FIG. 15 indicates phase characteristics when the capacitors CA1 and CA2 are not provided, and B2 indicates phase characteristics when the capacitors CA1 and CA2 are provided. For example, until the frequency reaches about 10 kHz, almost no phase difference occurs between the input voltage V2 and the input voltage V1 in the case of B1 in which the capacitors CA1 and CB2 are not provided and in the case of B2 in which the capacitors CA1 and CA2 are provided. On the other hand, in the case of B1 in which the capacitors CA1 and CA2 are not provided in the high frequency band, the phase difference between the input voltage V1 and the input voltage V2 is large, and the reference voltage VRF decreases due to the phase difference. In contrast, in the case of B2 in which the capacitors CA1 and CA2 are provided, the phase difference between the input voltage V1 and the input voltage V2 does not occur so much even in the high frequency band, and the decrease in the reference voltage VRF due to the phase difference is prevented.

As described above, the integrated circuit device 2 according to the embodiment includes the semiconductor substrate PSUB set at the substrate potential, the rectifier circuit 10, and the BGR circuit 20. The BGR circuit 20 includes the operational amplifier OP1, the diode elements D1 and D2, the resistor RA1, and the capacitors CA1 and CA2. The diode element D1 implemented by the bipolar transistor BP1 or the like is provided between the first input terminal of the operational amplifier OP1 and the substrate potential node NS. The diode element D2 implemented by the bipolar transistor BP2 or the like and the resistor RA1 are provided between the second input terminal of the operational amplifier OP1 and the substrate potential node NS. The capacitor CA1 which is the first capacitor is provided between the first input terminal of the operational amplifier OP1 and the substrate potential node NS, and the capacitor CA2 which is the second capacitor is provided between the second input terminal of the operational amplifier OP1 and the substrate potential node NS. In this case, when noise occurs at the substrate potential of the semiconductor substrate PSUB due to the rectification operation of the rectifier circuit 10 and the amplitude difference or the phase difference occurs between the input voltage V1 of the first input terminal and the input voltage V2 of the second input terminal due to the noise, a situation in which the reference voltage VRF fluctuates occurs. In this regard, in the embodiment, the capacitor CA1 is provided in parallel with the diode element D1 between the first input terminal of the operational amplifier OP1 and the substrate potential node NS, and the capacitor CA2 is provided in parallel with the resistor RA1 and the diode element D2 between the second input terminal and the substrate potential node NS. By providing such capacitors CA1 and CA2, it is possible to reduce the amplitude difference and the phase difference between the input voltage V1 and the input voltage V2 due to the noise at the substrate potential, and it is possible to prevent the situation in which the reference voltage VRF fluctuates.

In this case, in the embodiment, the diode capacitance of the diode element D2 which is the second diode element is set to be larger than the diode capacitance of the diode element D1 which is the first diode element, and the capacitances of the capacitors CA1 and CA2 are set to be capacitances larger than the diode capacitance of the diode element D2. For example, when the diode elements D1 and D2 are the bipolar transistors BP1 and BP2, the diode capacitance of the diode element D2 is larger than the diode capacitance of the diode element D1 by setting the emitter area of the bipolar transistor BP2 to be larger than the emitter area of the bipolar transistor BP1. For example, the diode capacitance of the diode element D2 is set to be N times the diode capacitance of the diode element D1. The capacitances of the capacitors CA1 and CA2 are set to be capacitances larger than the diode element D2, which is set to have such a large diode capacitance. In this way, for example, in a high frequency band, the impedance in the path of the capacitors CA1 and CA2 set to be a large capacitance can be reduced. Accordingly, the fluctuation of the input voltages V1 and V2 due to the noise at the substrate potential is prevented, and the fluctuation of the reference voltage VRF due to the amplitude difference or the phase difference between the input voltages V1 and V2 can be prevented.

For example, in the embodiment, when the capacitance of the capacitor CA1 is C1, the capacitance of the capacitor CA2 is C2, and the capacitance of the diode element D2 is CD2, C1 and C2 are set to be twice or more of CD2. More preferably, C1 and C2 are set to be four times or more of CD2. In this way, for example, in the high frequency band, the impedance in the path of the capacitors CA1 and CA2 can be sufficiently reduced compared to the impedance in the path of the diode element D1 and the impedance in the path of the resistor RA1 and the diode element D2. Accordingly, it is possible to prevent the reference voltage VRF from fluctuating due to the amplitude difference or the phase difference between the input voltages V1 and V2.

In the embodiment, the rectifier circuit 10 rectifies the AC voltages VC1 and VC2 having a frequency of, for example, 10 MHz or more. As described above, when the frequencies of the AC voltages VC1 and VC2 are 10 MHz or more, it is possible to increase the power transmission frequency in contactless power transmission or the like, and it is possible to implement, for example, size reduction of coils and improvement in power transmission efficiency. Further, according to the embodiment, the capacitors CA1 and CA2 with large capacitances having low impedance in the high frequency band are provided between the first input terminal, the second input terminal, and the substrate potential node NS. Therefore, even when the noise caused by the rectification operation at a high frequency of 10 MHz or more occurs at the substrate potential, the reference voltage VRF can be prevented from fluctuating due to the amplitude difference or the phase difference between the input voltages V1 and V2. The frequencies of the AC voltages VC1 and VC2 may be lower than 10 MHz, for example, in a range of 100 kHz to 10 MHz.

3. Specific Example of Integrated Circuit Device

Figure 16:
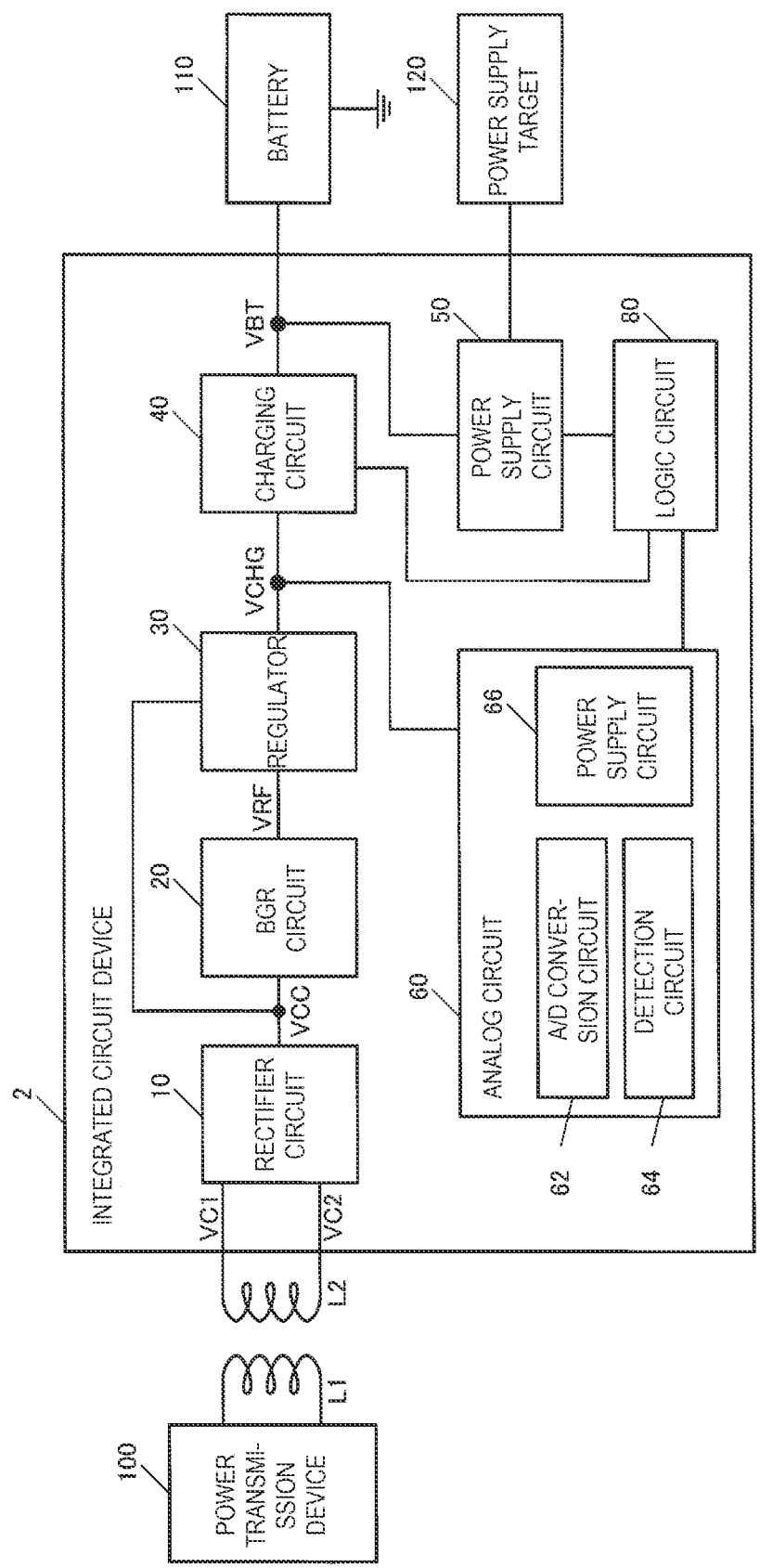
FIG. 16 is a specific configuration example of the integrated circuit device according to the embodiment.

FIG. 16 shows a specific configuration example of the integrated circuit device 2 according to the embodiment. FIG. 16 is an application example for a contactless power transmission system, and the integrated circuit device 2, which is a power reception control device, performs control for receiving transmission power from a power transmission device 100 in a contactless manner. For example, primary coils L1 are provided on a power transmission device 100 side, and secondary coils L2 are provided on a power reception device side implemented by the integrated circuit device 2. When a power transmission driver of the power transmission device 100 applies an AC voltage to the primary coils L1, power is wirelessly transmitted from the primary coils L1 to the secondary coils L2, and the power reception device implemented by the integrated circuit device 2 receives the transmitted power.

The integrated circuit device 2 includes the rectifier circuit 10, the BGR circuit 20, and the regulator 30. In addition, the integrated circuit device 2 may include a charging circuit 40, a power supply circuit 50, an analog circuit 60, and a logic circuit 80.

The rectifier circuit 10 operating as a power reception circuit converts the AC voltages VC1 and VC2 induced in the secondary coils L2 into the DC rectified voltage VCC. The BGR circuit 20 generates the reference voltage VRF based on the rectified voltage VCC. The regulator 30 regulates the rectified voltage VCC based on the reference voltage VRF from the BGR circuit 20 to generate the regulated voltage VCHG. Accordingly, it is possible to generate a stable regulated voltage VCHG of a constant voltage from the rectified voltage VCC obtained by rectifying the AC voltages VC1 and VC2. The rectifier circuit 10, the BGR circuit 20, and the regulator 30 are circuits including, for example, high-voltage (HV) transistors with a high breakdown voltage. In addition, in the integrated circuit device 2, circuits other than the rectifier circuit 10, the BGR circuit 20, and the regulator 30 are circuits including, for example, low-voltage (LV) transistors with a low breakdown voltage lower than HV.

The charging circuit 40 charges a battery 110 based on the regulated voltage VCHG from the regulator 30. A battery voltage VBT is, for example, a voltage of a positive electrode of the battery 110. For example, the charging circuit 40 includes a charging transistor and a charging control circuit that controls the charging transistor. The charging transistor is provided, for example, between an input node of the regulated voltage VCHG and an output node of the battery voltage VBT. Further, the charging control circuit controls a gate of the charging transistor, thereby performing constant current charging (CC charging) or constant voltage charging (CV charging) of the battery 110. For example, the constant current charging or the like is implemented by detecting a charging current from the charging transistor using a sense resistor or the like, and controlling the gate of the charging transistor by the charging control circuit based on a detection result.

The power supply circuit 50 operates based on the battery voltage VBT to supply the power to a power supply target 120. For example, the power supply circuit 50 supplies an output voltage generated based on the battery voltage VBT as a power supply voltage to the power supply target 120. The power supply target 120 is a processing device such as a microcontroller. For example, the power supply circuit 50 includes a charge pump circuit, and the charge pump circuit performs a charge pump operation of stepping down the battery voltage VBT and supplies an output voltage obtained by stepping down the battery voltage VBT to the power supply target 120. The power supply circuit 50 can also be referred to as a discharge circuit of the battery 110.

The analog circuit 60 is a circuit that performs analog processing. The analog circuit 60 operates based on, for example, the regulated voltage VCHG from the regulator 30, and performs the analog processing based on an analog signal. The analog signal is an analog voltage or an analog current. The analog circuit 60 includes, for example, an operational amplifier, an active element such as a transistor, and a passive element such as a capacitor and a resistor.

The analog circuit 60 may include an A/D conversion circuit 62, a detection circuit 64, and a power supply circuit 66. The A/D conversion circuit 62 performs, for example, A/D conversion of the analog voltage, and outputs digital data. The analog current may be converted into the analog voltage using, for example, a current and voltage conversion circuit, and converted into the digital data using the A/D conversion circuit 62. The A/D conversion circuit 62 can perform, for example, A/D conversion of the battery voltage VBT or A/D conversion of the charging current into a voltage.

The detection circuit 64 performs various kinds of detection processing in the integrated circuit device 2. For example, the detection circuit 64 can implement processing of detecting and monitoring the battery voltage VBT, processing of detecting and monitoring the charging current, or temperature detection processing based on a signal from a temperature sensor provided inside or outside the integrated circuit device 2.

The power supply circuit 66 generates various power supply voltages of the integrated circuit device 2. For example, the power supply circuit 66 generates, based on the regulated voltage VCHG from the regulator 30, a power supply voltage of each circuit of the analog circuit 60, and a power supply voltage of the logic circuit 80. Each circuit of the analog circuit 60 is, for example, a circuit other than the power supply circuit 66 of the analog circuit 60, and includes the A/D conversion circuit 62 and the detection circuit 64. For example, the power supply circuit 66 may include a regulator that generates the power supply voltage to be supplied to each circuit of the analog circuit 60 and a regulator that generates the power supply voltage to be supplied to the logic circuit 80.

The logic circuit 80 is, for example, a control circuit of the integrated circuit device 2, and is, for example, a digital circuit that performs digital processing using a digital signal. The logic circuit 80 performs, for example, control processing of each circuit of the integrated circuit device 2, communication processing with an external device, various kinds of interface processing, or command execution processing. For example, the logic circuit 80 performs charging control processing for the charging circuit 40, power supply control processing for the power supply circuit 50, or control processing for the power supply circuit 66. Alternatively, the logic circuit 80 may control the rectification operation of the rectifier circuit 10 or perform control processing of the BGR circuit 20 and regulator 30.

As described above, the integrated circuit device according to the embodiment includes a semiconductor substrate set at a substrate potential, a rectifier circuit that rectifies an AC voltage by a rectifier element provided at the semiconductor substrate and outputs a rectified voltage, and a bandgap reference circuit provided at the semiconductor substrate and generates a reference voltage. The bandgap reference circuit includes an operational amplifier having a first input terminal and a second input terminal, a first diode element provided between the first input terminal and a substrate potential node, and a resistor and a second diode element provided in series between the second input terminal and the substrate potential node. In addition, the bandgap reference circuit includes a first capacitor provided between the first input terminal and the substrate potential node, and a second capacitor provided between the second input terminal and the substrate potential node.

According to the embodiment, the first capacitor is provided in parallel with the first diode element between the first input terminal of the operational amplifier and the substrate potential node, and the second capacitor is provided in parallel with the resistor and the second diode element between the second input terminal of the operational amplifier and the substrate potential node. By providing such a first capacitor and a second capacitor, an amplitude difference and a phase difference between a first input voltage and a second input voltage of the operational amplifier due to the noise at the substrate potential can be reduced, and a situation in which the reference voltage fluctuates can be prevented.

In the embodiment, a diode capacitance of the second diode element may be larger than a diode capacitance of the first diode element, and a capacitance of the first capacitor and a capacitance of the second capacitor may be larger than the diode capacitance of the second diode element.

In this way, for example, in a high frequency band, impedance in a path of the first capacitor and the second capacitor set at a large capacitance can be reduced. Accordingly, fluctuations of the first input voltage and the second input voltage of the operational amplifier due to the noise at the substrate potential are prevented, and the fluctuation of the reference voltage due to the amplitude difference or the phase difference between the first input voltage and the second input voltage can be prevented.

In the embodiment, when the capacitance of the first capacitor is C1, the capacitance of the second capacitor is C2, and the capacitance of the second diode element is CD2, C1 and C2 may be twice or more of CD2.

In this way, for example, in a high frequency band, the impedance in the path of the first capacitor and the second capacitor can be sufficiently reduced compared to the impedance in the path of the first diode element and the impedance in the path of the resistor and the second diode element.

In the embodiment, the bandgap reference circuit may include a first transistor that is provided between a rectified voltage node and the first input terminal and has a gate coupled to an output terminal of the operational amplifier, and a second transistor that is provided between the rectified voltage node and the second input terminal and has a gate coupled to the output terminal.

In this way, feedback control is performed so that the first input terminal and the second input terminal have the same voltage due to a virtual ground of the operational amplifier. Accordingly, a current obtained by the feedback control flows through the first diode element provided in series with the first transistor and the second diode element provided in series with the second transistor, and a reference voltage based on the bandgap voltage can be generated.

In the embodiment, the bandgap reference circuit may include a third transistor that is provided between the rectified voltage node and an output node of the bandgap reference circuit and has a gate coupled to the output terminal of the operational amplifier, and an output resistor that is provided between the output node and the substrate potential node.

In this way, under control of an output of the operational amplifier, a current equal to a current flowing through the first transistor and the second transistor flows through the third transistor and flows through the output resistor. Accordingly, the reference voltage set by the current and a resistance value of the output resistor can be output.

In the embodiment, the first diode element and the second diode element may be diode-coupled bipolar transistors.

In this way, the first diode element and the second diode element can be implemented using a PN junction between a base and an emitter of the bipolar transistor, and the reference voltage can be generated using a base-emitter voltage of the bipolar transistor or a difference between the base-emitter voltages of the bipolar transistors.

In the embodiment, a regulator that regulates the rectified voltage based on the reference voltage output from the bandgap reference circuit and outputs a regulated voltage may be provided.

In this way, the stable reference voltage of a constant voltage output from the bandgap reference circuit can be used to generate the regulated voltage of the constant voltage obtained by regulating the rectified voltage.

In the embodiment, the rectifier circuit may include a Schottky-type first diode provided between a first input node and a rectified voltage node, a Schottky-type second diode provided between the first input node and a substrate potential node, a Schottky-type third diode provided between a second input node and the rectified voltage node, and a Schottky-type fourth diode provided between the second input node and the substrate potential node.

When the Schottky-type diode having a high switching speed is used as described above, the rectifier circuit can appropriately perform the rectification operation to generate the rectified voltage even when a frequency of an AC voltage is high.

In the embodiment, the rectifier circuit may rectify an AC voltage having a frequency of 10 MHz or more.

As described above, when the frequency of the AC voltage is 10 MHz or more, it is possible to increase power transmission frequency in, for example, contactless power transmission, and it is possible to implement improvement in power transmission efficiency.

Although the embodiment has been described in detail above, it can be easily understood by those skilled in the art that many modifications can be made without substantially departing from the novel matters and effects of the present disclosure. Accordingly, all such modifications are within the scope of the present disclosure. For example, a term described at least once together with a different term having a broader meaning or the same meaning in the description or the drawings can be replaced with the different term at any place in the description or the drawings. All combinations of the embodiment and the modifications are also within in the scope of the present disclosure. The configurations, operations, and the like of the integrated circuit device are not limited to those described in the embodiment, and various modifications can be made.

What is claimed is:

1. An integrated circuit device comprising:
   a semiconductor substrate set at a substrate potential;
   a rectifier circuit configured to rectify an AC voltage by a rectifier element provided at the semiconductor substrate and output a rectified voltage; and
   a bandgap reference circuit provided at the semiconductor substrate and configured to generate a reference voltage based on the rectified voltage, wherein
   the bandgap reference circuit includes
      an operational amplifier having a first input terminal and a second input terminal,
      a first diode element provided between the first input terminal and a substrate potential node, a resistor and a second diode element provided in series between the second input terminal and the substrate potential node, a first capacitor provided between the first input terminal and the substrate potential node, and a second capacitor provided between the second input terminal and the substrate potential node.

2. The integrated circuit device according to claim 1, wherein a diode capacitance of the second diode element is larger than a diode capacitance of the first diode element, and a capacitance of the first capacitor and a capacitance of the second capacitor are larger than the diode capacitance of the second diode element.

3. The integrated circuit device according to claim 2, wherein when the capacitance of the first capacitor is C1, the capacitance of the second capacitor is C2, and the capacitance of the second diode element is CD2, C1 and C2 are twice or more of CD2.

4. The integrated circuit device according to claim 1, wherein the bandgap reference circuit includes a first transistor that is provided between a rectified voltage node and the first input terminal and has a gate coupled to an output terminal of the operational amplifier, and a second transistor that is provided between the rectified voltage node and the second input terminal and has a gate coupled to the output terminal.

5. The integrated circuit device according to claim 4, wherein the bandgap reference circuit includes a third transistor that is provided between the rectified voltage node and an output node of the bandgap reference circuit and has a gate coupled to the output terminal of the operational amplifier, and an output resistor that is provided between the output node and the substrate potential node.

6. The integrated circuit device according to claim 1, wherein the first diode element and the second diode element are diode-coupled bipolar transistors.

7. The integrated circuit device according to claim 1, further comprising:

a regulator configured to regulate the rectified voltage based on the reference voltage output by the bandgap reference circuit and output a regulated voltage.

8. The integrated circuit device according to claim 1, wherein the rectifier circuit includes a Schottky-type first diode provided between a first input node and the rectified voltage node, a Schottky-type second diode provided between the first input node and the substrate potential node, a Schottky-type third diode provided between a second input node and the rectified voltage node, and a Schottky-type fourth diode provided between the second input node and the substrate potential node.

9. The integrated circuit device according to claim 1, wherein the rectifier circuit rectifies the AC voltage having a frequency of 10 MHz or more.

* * * * *